United States Patent [19]

Pyee

[11] 4,353,070
[45] Oct. 5, 1982

[54] BROAD BAND SYSTEM OPERATING IN THE SUBMILLIMETER WAVE RANGE

[75] Inventor: Maurice Pyee, Le Plessis Trevise, France

[73] Assignee: Agence Nationale de Valorization de la Recherche, Paris, France

[21] Appl. No.: 173,067

[22] Filed: Jul. 28, 1980

[30] Foreign Application Priority Data

Aug. 1, 1979 [FR] France .................. 79 19762

[51] Int. Cl.³ .............................................. H01Q 3/26
[52] U.S. Cl. .................... 343/701; 343/854; 357/9
[58] Field of Search ................ 343/701, 853, 854; 357/9, 15

[56] References Cited

FOREIGN PATENT DOCUMENTS 2134610 3/1972 France .
2394896 6/1977 France .

OTHER PUBLICATIONS

Small et al., Applied Physics Letters, vol. 24, No. 6, Mar. 15, 1974, pp. 275-279, 343-701.
Gustafson et al., Applied Physics Letters, vol. 25, No. 1, Jul. 1, 1974, pp. 56-59.

Primary Examiner—Eli Lieberman
Attorney, Agent, or Firm—Larson and Taylor

[57] ABSTRACT

A high speed detection system for operation with submillimeter wave radiation comprises a plurality of non-linear elements and an antenna structure for coupling said elements and the radiation. The elements are typically Schottky diodes and are distributed in a one dimension or two dimension planar arrangement. The antenna structure includes a curtain of antennae several wavelengths long, in parallel relation and having point like contact with the non-linear elements.

12 Claims, 12 Drawing Figures

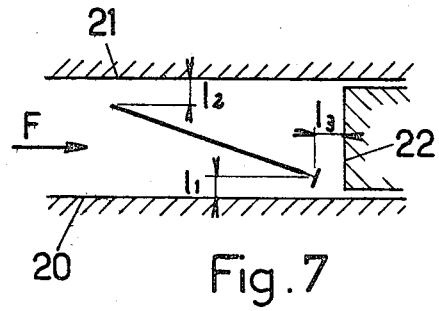
Fig. 7
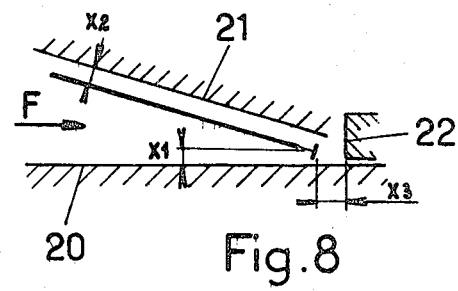
Fig. 8
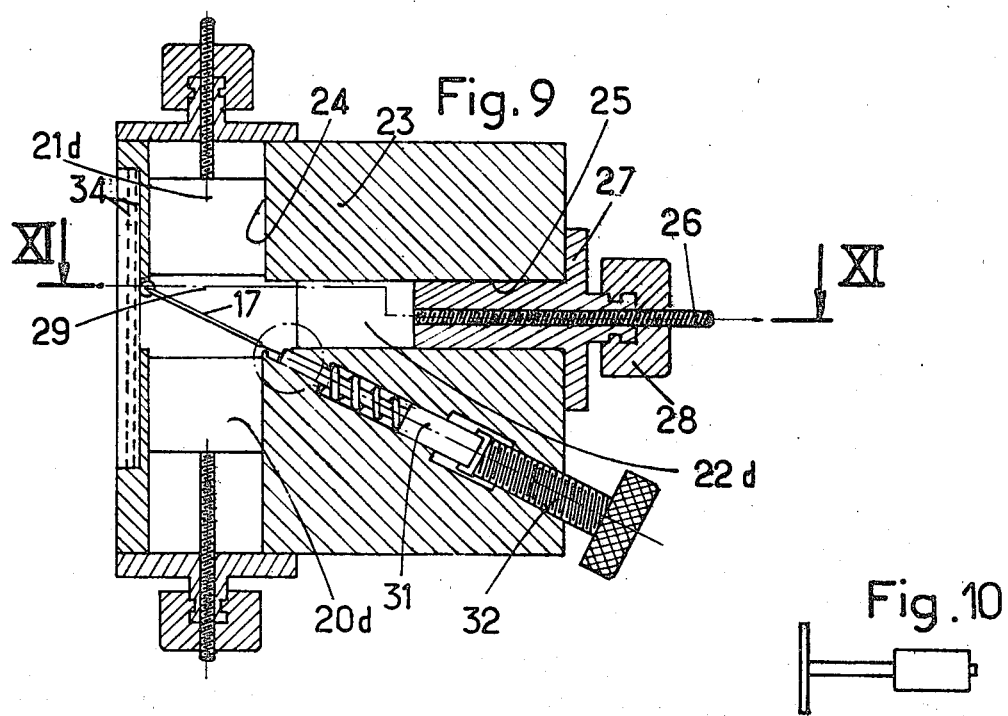
Fig. 9
Fig. 10
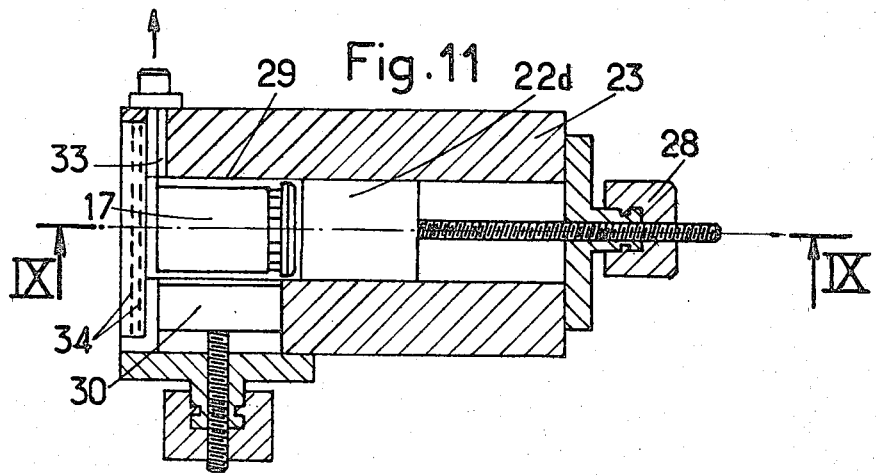
Fig. 11

BROAD BAND SYSTEM OPERATING IN THE SUBMILLIMETER WAVE RANGE

BACKGROUND AND SUMMARY OF THE INVENTION

The invention relates to microwave systems operating in the submillimeter wave range, typically from 10 μm to 1 mm, suitable for use as sources, detectors and mixers.

There exist some high-speed broad band detectors suitable for use in the submillimeter range, which belong to the far infra-red and the microwave field. Almost all of these detectors use non-linear elements consisting of Schottky diodes which have the advantages of wide band characteristics and operation at ambient temperature. However, the Schottky diodes must then have a very small surface (less than a square micron) and they must be associated with a feed structure. The high losses in materials conductive to submillimeter waves prevent using metal wave guides and lead to using antennas for coupling the waves.

In a prior art detector, the supply structure for coupling the incident radiation and the Schottky junction comprises a wire whose pointed end portion contacts the anode of the diode. The antenna consists of the portion of the wire between the contact point and a highly curved portion which also acts as a spring forcibly applying the wire against the anode. Such a coupling between the long antenna thus formed and the non-linear element constituted by the Schottky diode is anything but satisfactory. The antenna has a radiation pattern with several transmission and reception lobes and the radiation diagram has a rotational symmetry. Consequently, part only of the main lobe is irradiated by the incident radiation very directional at that frequency; sensitivity is consequently decreased and in addition part of the energy is re-transmitted to lobes other than that which collects microwaves energy.

It is an object of the invention to provide an improved system suitable for use in the submillimeter range, which has a high sensitivity whilst simple in construction.

For that purpose, the system comprises a plurality of non-linear elements distributed according to a planar one or two dimensional array and an antenna structure for coupling said plurality of elements and the submillimeter wave radiation. The structure includes a curtain of long antenna wire antenna elements, i.e., antenna elements several wavelengths long, in parallel electric relation and having point-like contacts with said plurality of elements. A point-like contact will designate a contact between an electrode of the non-linear element and part only of the antenna over an area which has a size which is a fraction of the wavelength, for instance 10 μm if the wavelength is 300 μm. In this respect it will be appreciated that the size of a Schottky diode may be as low as 0.1 μm.

When the system is to be used as a detector or mixer, the non-linear response elements will typically consist of a two dimensional array of Schottky diodes on a composite semiconductor plate, such as gallium arsenide. Provided that epitaxial doped gallium arsenide is used, so that the conduction is by a thermo-ionic process rather than by tunnel effect, it is possible to achieve satisfactory operation up to a frequency of about 3 THz. Other non linear elements may however be used, such as MIM (metal-insulating material) and planar Josephson junctions.

The increase in sensitivity provided by the invention does not result merely from the increase in the number of associated detector and antenna elements, but essentially from the radical change of the radiation pattern due to elimination of the rotational symmetry and enhancement of a main antenna lobe at the expense of the others. In use the detector will be angularly located for the direction of the incident radiation to coincide approximately with the axis of the main lobe.

When the system is to be used as a source, the non-linear elements may be Schottky diodes with tuning on a higher harmonic, whereby it is possible to reach 800 MHz. Tunnel diodes and quasi-particle junctions operating at cryogenic temperatures may also be used.

Numerous embodiments of the flat antenna structure are possible. The array should be usch that the antenna elements are correctly connected to the anodes of the diodes, are perfectly parallel and are evenly spaced where they contact the diodes.

In a particular embodiment, the curtain comprises a set of parallel wires each in contact with an associated non-linear element through a blunt pointed tip; but it is then difficult to maintain satisfactory parallelism of the wires without burying them in a dielectric support. Now, the majority of dielectrics commercially utilized at present are absorbent over a wide band of the spectrum, whence loss of sensitivity. In a modified embodiment, the set of wires are in the form of thin linear conductors constituted by photoprinting on an insulating layer which also has a superstrate of semi-conductor material in which the non-linear response elements, typically Schottky diodes, are constituted. Such a system is of advantage since it may be manufactured by conventional planar technology used in the LSI field. In yet another embodiment, the curtain comprises an electrically conductive plate (which amounts to an infinity of close wires), coupled to the non-linear response elements by separate pointed tips or cat whiskers. Experience has shown that good results are obtained with a flat plate whose length $l$ corresponds to a few wave lengths and whose width W is such that $3.5/5 \leq w/l \leq 4/5$. The pointed tips may be the end portions of parallel wires electrically and mechanically fast with the plate, arranged symmetrically with respect to the mid plane of the latter, two end wires being arranged along the lateral edges.

Finally, to further reduce the secondary lobes and reinforce the main lobe, it will generally be advantageous to associate one or several reflectors with the antenna curtain. Several reflectors may be combined with an input grid to form a tuned resonant cavity.

Whatever the embodiment, broad band detection may be achieved; associating a feeding antenna structure to a plurality of non-linear elements facilitates mutual matching. The invention may be implemented using planar techniques.

The invention is suitable for use in numerous applications, particularly the construction of submillimeter video-frequency radiation detectors and of mixers supplying an intermediate frequency resulting from bearing of the submillimeter waves and of a harmonic from a local source, such as a phase referenced klystron. The radiation may originate from various sources including lasers, for example hydrocyanic acid lasers emitting at 0.80 THz, carcinotrons and gyrotrons which have the advantage of supplying a very high power.

The invention will be better understood from the following description of particular embodiments.

SHORT DESCRIPTION OF THE DRAWINGS

FIG. 1 is a schematic diagram illustrating basic features of the invention,

FIG. 2 is a diagram on an enlarged scale showing the junction between a point and the anode of a Schottky diode, FIG. 3, similar to FIG. 1, shows a particular embodiment, FIGS. 4a and 4b are diagrammatic views in perspective and in partial section showing planar embodiments, FIG. 5, similar to FIG. 1, shows another embodiment using a plate sensor, FIG. 6 is a diagram showing the impedance in the system of FIG. 5, FIGS. 7 and 8 show two possible physical arrangements of reflectors, FIG. 9 is an illustration of a detector system in section along line IX—IX of FIG. 11, FIG. 10 is an enlarged view of that area in a dash-dot circle in FIG. 9, FIG. 11 is a section along line XI—XI of FIG. 9.

DETAILED DESCRIPTION OF PREFERRED EMBODIMENTS

Figure 1:
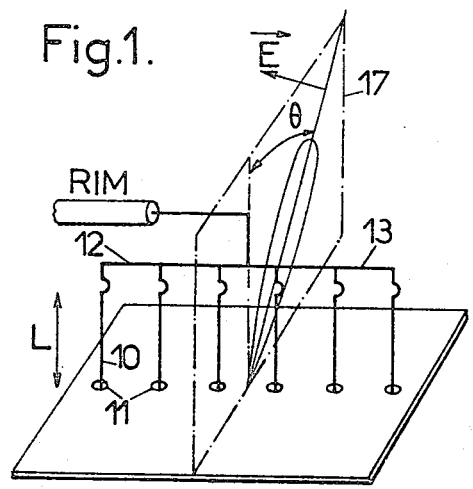

As shown in FIG. 1, a detector system comprises a plurality of a cluster of n wires 10 arranged in parallel relation, at equal intervals, forming an array or curtain. Each of the wires 10 has an end portion in the form of a blunt portion of contact with a corresponding Schottky diode 11. The antenna portion is defined opposite the point by a loop or bend 12 forming a spring and is connected to a conductor 13 connected to the output. Each wire is equivalent to a wire antenna whose length L corresponds to the distance between the point and the change in curvature of the wire, at the input of the bend. That length will always represent several wavelengths.

Figure 2:
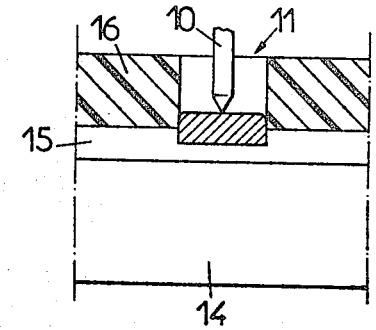

Schottky diodes, essentially comprising a metal zone in intimate contact with a semiconductor without an interposed oxide layer, give satisfactory results in the submillimeter wave range provided they have a very small surface area and they are formed on a semiconductor of very high mobility. It is possible to constitute such diodes in the form of an array on a semiconductor layer of gallium arsenide. Referring to FIG. 2, a thin layer of n type gallium arsenide 15 is grown by epitaxy on a substrate 14 of type n+. A thin film of insulating silica 16 (typically about 1000 A) is deposited on layer 15. By masking and electron or X-ray microlithography, window zones exposing layer 15 are formed, on an area not exceeding 1 $\mu m^2$. Finally, the bottom of the windows thus formed is metalized to constitute the anodes.

The wires 10 will generally be of tungsten, with a diameter which may hardly be less than 10 $\mu m$. The pointed end tips can be formed by electrolysis in an alkali aqueous solution (for example 3 N Na OH) or an acid solution (for example 1 N $HNO_3$ + 1 N HF).

The resulting detector system has a radiation pattern which exhibits a maximum in the mid plane 17 of the array (FIG. 1). Sensitivity is at a maximum in a direction forming an angle $\theta$ with the direction of the wires; the value of $\theta$ is approximately as given by the formula:

$$\sin \theta \simeq 0.43 \sqrt{\lambda_0/L} .$$

In this formula, $\lambda_0$ is the wavelength of the radiation.

The sensitivity of the detector to a radiation field increases in proportion to $\sqrt{n}$, n being the number of diodes and of wires, at least as long as the wires 10 are parallel, equidistant and interconnected.

Construction of the arrangement just described presents difficulties, particular with respect to connecting all anodes satisfactorily to the wires, due to bending on contact, and to distributing all wires at equal intervals.

Figure 3:
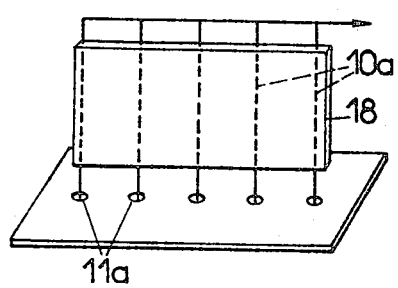

That difficulty is overcome to some extent in the embodiment which is shown diagrammatically in FIG. 3. The wires 10a are retained on or in a thin support 18 of dielectric material transparent to the radiation which holds the wires in place. It is then possible to fabricate the wire array by winding a continuous filament on a flat mandrel, with a constant small pitch, then by molding the rectilinear parts of the winding in a sheet 18 and then cutting the winding along two generatrices to form the wires 10a. The wires are then treated electrolytically at one end to form the blunt contact points.

While that solution is satisfactory from the mechanical point of view, it has the drawback of requiring the use of dielectrics having sufficient transparency in the submillimeter range. In this regard, dielectric plastics currently available at the present time (polytetrafluoroethylene, polyethylene, etc.) have a substantial absorption which results in a loss in sensitivity.

In particularly advantageous embodiments, a "planar" technique approaching that used for the production of integrated circuits may be used and provides a monolithic structure coupling the non-linear response elements, typically diodes, and the antenna curtain.

Figure 4A:
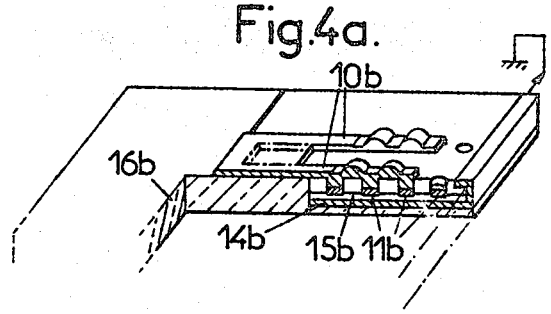

Referring to FIG. 4a, there is shown a detector system using Schottky diodes as non-linear response elements. The antenna curtain is formed on a base layer 16b of dielectric insulating material transparent to microwaves. Conventional etching, deposition, doping and oxidizing processes are used to deposit an ohmic contact strip 14b (which will constitute the cathode connection to all Schottky diodes), then to grow an epitaxial superlayer 14b of n-type Ga As, and finally an insulating layer, typically of silicon oxide. The insulating material is removed at locations distributed over layer 15b according to a two-dimensional matrix array to expose window areas of layer 15b. Removal will typically be by electron or X-ray photolithography, due to the small size of the opening. Then an array of Schottky diodes 11b is formed through the windows.

A metal (typically gold or aluminum) is then evaporated and partially removed by masking and etching to form, on the insulating material, the antenna curtain connected to the anodes of the Schottky diodes. As illustrated in full line, antenna 10b comprises a rectangular overlay with parallel projecting strips of low thickness and width.

The problems of mechanical strength are thus solved. The available techniques of photolithography available enable small strip size and diode areas to be achieved. If such techniques are utilized, the separation between the diodes 11b is no longer limited by technological requirements, but rather by physical requirements. The anodes connected to the antenna should be sufficiently spaced from one another not to discharge into one another. In other words, the spacing between the anodes of active diodes (i.e. of the connected diodes) must be large as compared with the length of diffusion of the minority carriers in the semiconductor material 15b. In practice, the separation must not be less than 15 μm in gallium arsenide. However, the problems of positioning the mask make exact alignment difficult and then impose a distribution pitch of the diodes of 15 μm at most to be certain that all the wires 11b are connected.

Rather than using a single sensor in the form of a plate, equivalent to infinitely closely spaced antennas, an array of antenna strips located side by side and interconnected at one end may be used, as indicated in dotted line.

Figure 4B:
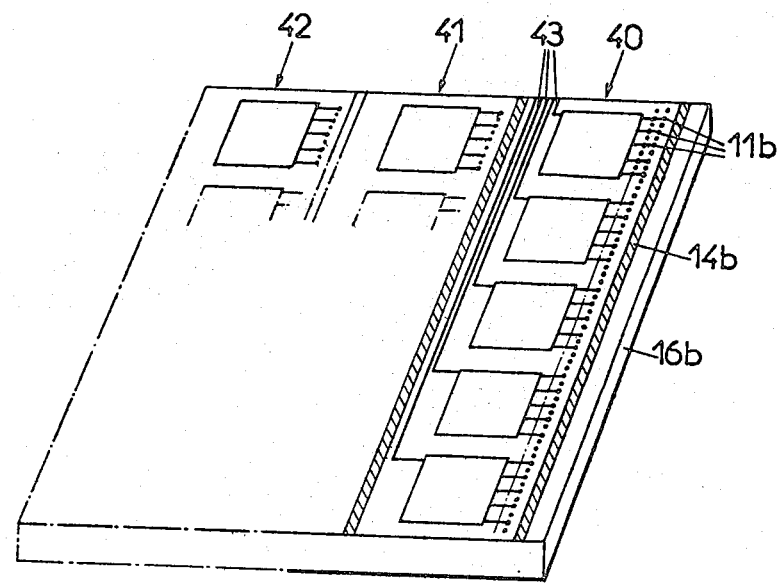

Referring to FIG. 4b, there is shown a system which incorporates a plurality of devices according to FIG. 4a on a same insulating base layer and which is particularly useful for imaging of a microwave radiation field, since it may achieve integration or at least summation. Three rows each having five antenna curtains 10b are formed on the base layer. Each curtain is connected to the anodes of an associated plurality of Schottky diodes 11b and provided with a separate anode output 43. The cathodes of all Schottky diodes in a same row are connected to a same ohmic contact 14b which is typically grounded. Since the base layer of the antenna curtains is a dielectric rather than a doped semiconductor, it does not act as a reflector for submillimeter waves and does not detrimentally affect reception. The outputs may be connected to appropriate circuits for summation of the signals.

Figure 5:
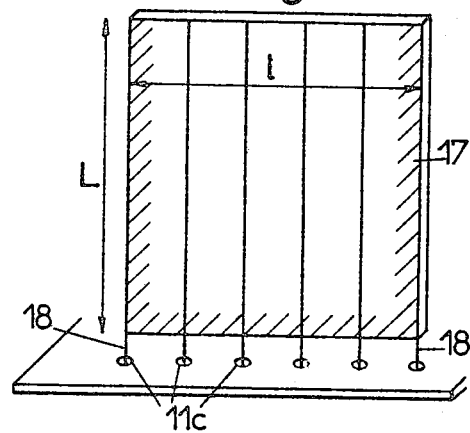

Referring now to FIG. 5, the system includes an antenna curtain consisting of a plate 17 unitary with pointed tips 18. The tips may be the end portions of wires secured to the plate or projections of the latter when it is formed by photolithography. The length L of the plate will always correspond to several wavelengths. Consequently, the principal antenna lobe will not be perpendicular to the array. A full study of the action of radio 1/L of the width l to the length L of the antenna has shown there is a maximum which, for L=5λ (λ being the wavelength), is relatively flat. In practice, satisfactory results as regards the ratio between the main lobe and the lateral lobes are obtained when 1/L is comprised between 3.5/5 and 4/5. The width of the principal lobe is reduced to about 25° in a plane parallel to the length of the plate 17 and perpendicular to the plate. The rotational symmetry is entirely broken; with five wires distributed evenly, there is obtained a main lobe whose angular width is about 25°, and which is much stronger than the secondary lobes.

Since very high frequency waves are involved, electric currents flow only along the edge portions of the plate, in the area shown diagrammatically by hatching in FIG. 5. Consequently, the two outer tips will advantageously be located along the lateral edges of the plate.

The amplitude of the main lobe increases substantially in proportion to $\sqrt{n}$ (n being the number of wires or points). Regarding the amplitude of the second lobe, it seems that saturation occurs as soon as n is equal to 5 approximately. In practice, five wires or tips give satisfactory results. The advantages to be gained by using more than ten wires do not balance the increased complexity.

Figure 6:
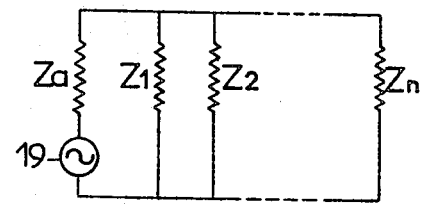

When the number of wires or of points is high, the system is equivalent to the circuit of FIG. 6. That circuit comprises several loads $Z_1, Z_2, \ldots Z_n$ constituted by the anodes connected in parallel relation and consequently decreasing the total impedance of the generator load. The impedance associated with the equivalent generator to the antenna will be designated $Z_a$.

Matching will be optimal and will result in maximum sensitivity if $Z_a^* = Z_{eq}$, where $Z_{eq}$ is the impedance equivalent to the load system, given by:

$$Z_{eq}^{-1} = \sum_{i}^{n} Z_i^{-1}$$

Impedance $Z_a$ depends on the frequency and the linear dimensions. The impedances $Z_i$ similarly depend on the frequency and the sizes, as well as the content in doping element.

In each case, an approximation could be made by calculation. By way of example, optimization was obtained at 1 THz i.e. λ=337 μm with the following values of the parameters:

n=7 wires
L=1.7 mm (approximately 5λ)
l=1.35 mm (approximately 4λ)
diameter of the diodes=0.8 μm.
expitaxy thickness: 1500 Å
carrier density $N=10^{17}/cm^3$ The sensitivity obtained was about 27 V/W without a reflector.

In order to reduce the influence of the secondary lobes which persist in the antennae described above, one or more reflectors may be added to modify the radiation pattern of the antenna particularly by restricting the field of view of the latter.

Referring to FIGS. 7 and 8, there is shown a possible antenna arrangement which includes three reflectors. As illustrated in FIG. 7, two parallel reflectors 20 and 21 are parallel to the incoming direction F of the incident radiation. The antenna array is at an angle θ (FIG. 1) with respect to F. The end portion of the array connected to the non-linear elements is close to the third reflector 22. Optimisation can then be effected by successively adjusting the distance $l_1$ between the reflector 20 and the wire ends, then distance $l_2$ between the reflector 21 and the other end of the array, and finally distance $l_3$. By way of example, it may be noted that for $l_1 = 0.98λ$, a maximum sensitivity was found for $l_2 = 4.58λ$. For those values of $l_1$ and $l_2$, an optimum was reached for $l_3 = 1.76λ$, λ being the incident wavelength.

Referring now to FIG. 8, there is shown an alternative arrangement in which reflector 20 is parallel to the direction of the incident radiation F and reflector 21 is parallel to the antenna array. Optimisation can then be achieved by successively adjusting $x_1$, $x_2$ and $x_3$ (the third reflector not being essential). It was found that an optimum is reached substantially for $x_1 = 0.98λ$ and $x_2 = 0.588λ$, 1.609λ or 2.693λ.

Either arrangement results in an increase of the value of the detected signal by a factor which is generally of from 5 to 8.

Numerous embodiments of the detectors which have been described are possible. Referring to FIGS. 9–11, there is shown a possible implementation with reflectors.

In a casing 23 consisting of several parts assembled together, there are formed two intersecting perpendicular bores 24 and 25. The detector is placed in the chamber 29 common to the two bores. The device is arranged for being angularly adjusted. During operation, it is directed for the incident radiation F to be coaxial with bore 25.

A reflector 22d is located in bore 25 and is carried by a threaded rod 26 which projects out of casing 23 through a plug 27. A control unit 28 rotatably connected to the plug 27 may be used to adjust the axial location of the reflector end rod whose rotation in bore 27 is prevented. Two confronting reflectors 20d and 21d are similarly mounted in bore 24. An additional reflector 30 (FIG. 11) may also be provided in a third bore perpendicular to the two preceding ones.

The detector is borne by a rod 31 (FIGS. 9 and 10) guided in a passage of the box at angle $\theta$ with the axis of bore 25. The rod 31 is adjustable in position by means of an adjustment screw 32.

Assuming that the detector is of the type illustrated in FIG. 5, the detector plate 17 is connected to an output socket 33 in line with that edge of the plate which is remote from the diodes. It is connected to the diodes, borne by the rod 31, through a series of parallel pointed tips.

If narrow band operation is necessary, while Schottky diodes constitute wide band detectors, the detection may take place in a cavity resonator. For this, two grids may be located in the aperture of the bore which receives the incident radiation and provided with adjustment means (not shown). The two grids acting as a Fabry-Perrot interferometer are used for control of the input transmission and define a multi-mode cavity whose coupling with the detector can be retouched until the critical value is reached.

While FIGS. 9 to 11 correspond to a reflector arrangement in accordance with the diagram of FIG. 7, it is possible to arrange the bores so that the receivers reproduce the diagram of FIG. 8. Whatever the embodiment, an open structure is obtained which increases the sensitivity of the detector and which reduces the radiation pattern to practically a single lobe, whose angular development is of about 20°.

As indicated above, the system can be used as a video-frequency detector, with an output through a hyper-frequency connector on a strip line. A Tee-connector may be used to connect the antenna and a D.C. source for diode bias. It may also be used as a heterodyne.

Numerous embodiments other than those described by way of example are possible. For instance, a semiconductor material other than Ga As may be used, provided that carrier mobility in that material is of the same order or higher. For instance, tellurium doped $In_x$ As $Ga_{1-x}$, n-doped Ga In Sb, Zn As, In Sb and Hg Cd Te may be used.

I claim:

1. A high speed microwave system for operation in the submillimeter wave radiation range, comprising a plurality of non-linear elements distributed in a regular planar array and an antenna structure for coupling said plurality of elements to the submillimeter wave radiation field, said antenna structure comprising a curtain of antenna members connected in parallel electrically and having point-like contacts which make electrical contact with said plurality of elements, said antenna members being constituted by a plate-like construction coupled to said non-linear elements through said point-like contacts.

2. A high speed microwave system for operation in the submillimeter wave radiation range, comprising:
a base layer of dielectric insulating material,
a strip of semiconductor material on part of said base layer,
an insulating layer on said semiconductor strip,
a plurality of non-linear elements distributed in a regular planar array in said semiconductor layer,
an antenna structure comprising a plate-like conductive layer formed directly on said base layer, and
electrical point-like contact means extending through said insulating layer for providing electrical contacts in parallel relation between said plurality of elements and said plate.

3. A high speed microwave system for operation in the submillimeter wave radiation range, comprising:
a base layer of dielectric insulating material,
a strip of semiconductor material on part of said base layer,
an insulating layer on said semiconductor strip,
a plurality of non-linear elements distributed in a regular planar array in said semiconductor layer,
an antenna structure comprising a curtain of antenna members connected in parallel at least at an end portion thereof remote from said elements and formed on said base layer at a distance from the part of said base layer on which said strip of semiconductor material is located,
and electrical point contact means formed in said insulating layer for connection between extensions of said antenna members and said plurality of non-linear elements.

4. System according to claim 1 wherein said plate-like construction includes a solid plate.

5. System according to claim 2 or 3 wherein the antenna structure has a length equal to a few wavelengths and a width comprised between 3.5/5 and 4.5/5 of the wavelength.

6. System according to claim 4, wherein the plate has a length equal to a few wavelengths and a width comprised between 3.5/5 and 4.5/5 of the wavelength.

7. Detector according to claim 6, wherein said tips are parts of parallel wires electrically connected to and mechanically secured to the plate, and projecting from the latter, arranged symmetrically with respect to the mid plane of the plate, the two wires remote from the midplane being along the lateral edges of the plate.

8. Detector according to claim 1, 2 or 3, wherein the antenna has an impedance Za substantially conjugated with the impedance $Z_{eq}$ equivalent to the resultant load constituted by said non-linear elements, as given by the formula:

$$\frac{1}{Z_{eq}} = \sum_{i}^{n} \frac{1}{Z_i}$$

where $Z_i$ is the elemental impedance of one non-linear element and n the number of said elements.

9. Detector system according to claim 1, 2 or 3, wherein said non-linear elements are Schottky diodes on a composite semiconductor, advantageously Ga-As, and the spacing between adjacent diodes is at most 15 microns.

10. Detector system according to claim 1, 2 or 3, comprising five to ten non-linear elements or non-linear element rows.

11. System according to claim 1, 2 or 3, further comprising at least one reflector for modifying the pattern of the antenna structure.

12. System according to claim 11, wherein the antenna structure is in a cavity bounded by said reflector and at least one input grid.

* * * * *